United States Patent
Tang et al.

(10) Patent No.: US 8,237,269 B2
(45) Date of Patent: Aug. 7, 2012

(54) HIGH Q TRANSFORMER DISPOSED AT LEAST PARTLY IN A NON-SEMICONDUCTOR SUBSTRATE

(75) Inventors: Yiwu Tang, San Diego, CA (US); Zhang Jin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1041 days.

(21) Appl. No.: 12/185,044

(22) Filed: Aug. 1, 2008

(65) Prior Publication Data

US 2010/0026368 A1    Feb. 4, 2010

(51) Int. Cl.
  *H01L 23/48* (2006.01)
  *H01L 27/08* (2006.01)
(52) U.S. Cl. .......................... 257/734; 257/531; 361/783
(58) Field of Classification Search .................. 455/333, 455/326, 292, 290; 257/690, 528, 531, 734; 336/200, 192, 195; 361/783, 760
See application file for complete search history.

(56) References Cited

U.S. PATENT DOCUMENTS

| | | | |
|---|---|---|---|
| 5,519,582 A | 5/1996 | Matsuzaki | |
| 5,872,393 A * | 2/1999 | Sakai et al. | 257/664 |
| 6,081,030 A | 6/2000 | Jaouen et al. | |
| 6,180,445 B1 | 1/2001 | Tsai | |
| 6,376,909 B1 * | 4/2002 | Forbes et al. | 257/734 |
| 6,833,285 B1 | 12/2004 | Ahn et al. | |
| 7,075,329 B2 | 7/2006 | Chen et al. | |
| 7,453,142 B2 * | 11/2008 | Lee et al. | 257/691 |
| 2004/0121606 A1 | 6/2004 | Raskin et al. | |
| 2006/0022336 A1 | 2/2006 | Franzon et al. | |
| 2008/0130257 A1 | 6/2008 | Li Puma et al. | |
| 2011/0084765 A1 * | 4/2011 | Kim et al. | 330/277 |
| 2011/0170231 A1 * | 7/2011 | Chandrasekaran et al. | 361/306.1 |

OTHER PUBLICATIONS

International Search Report and Written Opinion—PCT/US2009/052580—ISA/EPO—Nov. 16, 2009.

* cited by examiner

*Primary Examiner* — Sonny Trinh
(74) *Attorney, Agent, or Firm* — Jonathan Velasco; S. Hossain Beladi (57) ABSTRACT

An assembly involves an integrated circuit die that is bonded, e.g., flip-chip bonded, to a non-semiconductor substrate by a plurality of low-resistance microbumps. In one novel aspect, at least a part of a novel high-frequency transformer is disposed in the non-semiconductor substrate where the non-semiconductor substrate is the substrate of a ball grid array (BGA) integrated circuit package. At least one of the low-resistance microbumps connects the part of the transformer in the substrate to a circuit in the integrated circuit die. At two gigahertz, the novel transformer has a coupling coefficient k of at least at least 0.4 and also has a transformer quality factor Q of at least ten. The novel transformer structure sees use in coupling differential outputs of a mixer to a single-ended input of a driver amplifier in a transmit chain of an RF transceiver within a cellular telephone.

39 Claims, 11 Drawing Sheets (PRIOR ART)
FIG. 1

EMBODIMENT #1
FIG. 8

EMBODIMENT #3
FIG. 20

HIGH Q TRANSFORMER DISPOSED AT LEAST PARTLY IN A NON-SEMICONDUCTOR SUBSTRATE

BACKGROUND INFORMATION

1. Technical Field

The disclosed embodiments relate to transformers for high frequency applications.

2. Background Information

Figures 1, 2, 3:
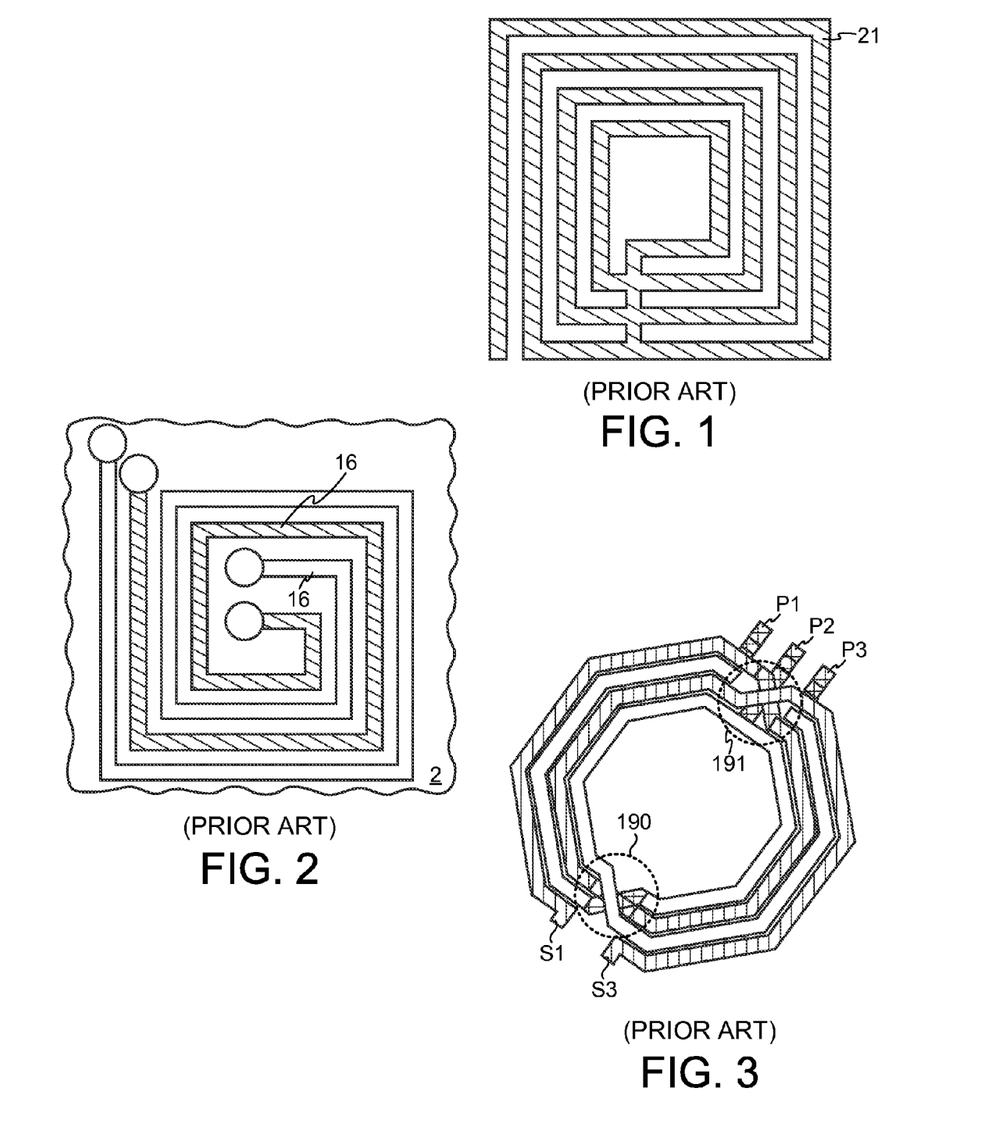
FIGS. 1, 2 and 3 (Prior Art) are perspective views of prior art structures that are realized on semiconductor substrates.

Radio frequency (RF) circuits such as transceivers found in cellular telephones often involve inductors and transformers. FIG. 1 (Prior Art) is a top-down view of a spiral-shaped inductor 21 disclosed in U.S. Pat. No. 6,180,445. Spiral-shaped inductor 21 is fabricated on a silicon substrate along with active devices in an active region of the silicon substrate. An inductor may also be partly disposed in a non-semiconductor substrate and connected by a microbump to circuitry in an IC, which can then be flip-chip bonded to a BGA package substrate.

U.S. Pat. No. 6,833,285 shows another example of a spiral-shaped inductor that is fabricated on a silicon substrate. The structure is part of a flip-chip silicon interposer. FIG. 2 (Prior Art) is a top-down view of a flip-chip transformer 16 that is disclosed in U.S. Published Patent Application US2004/0121606. Transformer 16 is fabricated on a semiconductor wafer 2. FIG. 3 (Prior Art) is a perspective view of an integrated transformer structure. The transformer involves three primary nodes P1, P2 and P3 and two secondary nodes S1 and S3. The primary nodes are connected to a mixer of a transmitter. One of the secondary nodes is connected to an input of a driver amplifier whereas the other of the secondary nodes is grounded. The mixer and driver amplifier and transformer are parts of a flip-chip packaged transceiver integrated circuit available from Qualcomm Incorporated. Prior art integrated transformer structures, for example such as the structures illustrated in FIGS. 2 and 3, generally have either an undesirably low quality factor Q, and/or an undesirably low coupling coefficient, and/or occupy an undesirably large amount of integrated circuit die area. An alternative, that has a high Q, an adequately high coupling coefficient, and that occupies a relatively small amount of integrated circuit die area is desired.

SUMMARY

An assembly involves an integrated circuit die that is flip-chip bonded to a non-semiconductor substrate by a plurality of flip-chip microbumps. The non-semiconductor substrate may, for example, be the substrate to which the bond balls of a ball grid array (BGA) integrated circuit package are attached. In one novel aspect, at least a part of a novel transformer is disposed in the non-semiconductor substrate. At least one of the flip-chip microbumps connects this part of the transformer in the non-semiconductor substrate to a circuit in the integrated circuit die. At two gigahertz, the novel transformer has a coupling coefficient k of at least 0.4 and also has a transformer quality factor Q of at least ten. The novel transformer has a self-resonant frequency greater than 4.0 gigahertz. The novel transformer sees use in coupling differential outputs of a mixer to a single-ended input of a driver amplifier in an RF transceiver integrated circuit die within a cellular telephone.

In one specific example, the non-semiconductor substrate is a multi-layer interconnect structure that includes several layers of metal interconnect and several layers of a non-semiconductor dielectric material. The integrated circuit die is an RF transceiver integrated circuit die that includes a mixer and a driver amplifier in a transmit chain of a radio transmitter circuit. The mixer drives the driver amplifier through the transformer. Part of the novel transformer is disposed in the integrated circuit die, thereby allowing small conductor widths and geometries to be used such that a high degree of coupling is achieved between the primary of the transformer and the secondary of the transformer. Another part of the novel transformer is disposed in the non-semiconductor substrate, thereby reducing parasitic capacitances and taking advantage of low resistance package metallization such that a high transformer quality factor (Q) is achieved. The part of the novel transformer that is disposed in the substrate is connected to associated circuitry in the integrated circuit die by one or more of the microbumps. By placing at least part of the novel transformer structure in the substrate, the amount of integrated circuit die area required to realize the transformer is reduced.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 4:
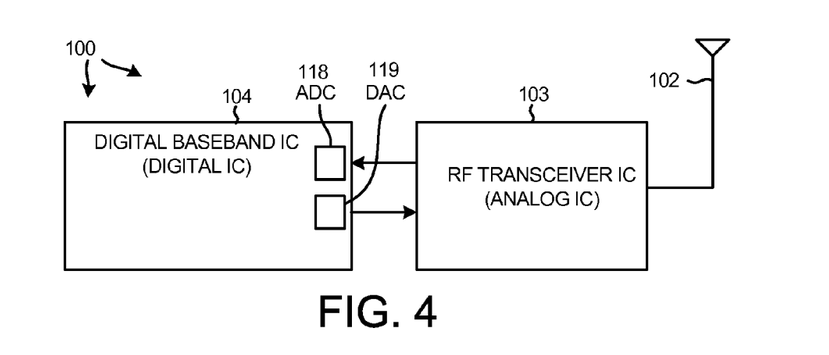
FIG. 4 is a high level block diagram of a mobile communication device 100 in accordance with one novel aspect.

FIG. 4 is a very simplified high level block diagram of one particular type of mobile communication device 100 in accordance with one novel aspect. In this particular example, mobile communication device 100 is a 3G cellular telephone capable of operating in accordance with a Code Division Multiple Access (CDMA) cellular telephone communication protocol. The cellular telephone includes (among several other parts not illustrated) an antenna 102 and two integrated circuits 103 and 104. Integrated circuit 104 is called a "digital baseband integrated circuit" or a "baseband processor integrated circuit". Integrated circuit 103 is an RF transceiver integrated circuit. RF transceiver integrated circuit 103 is called a "transceiver" because it includes a transmitter as well as a receiver.

Figure 5:
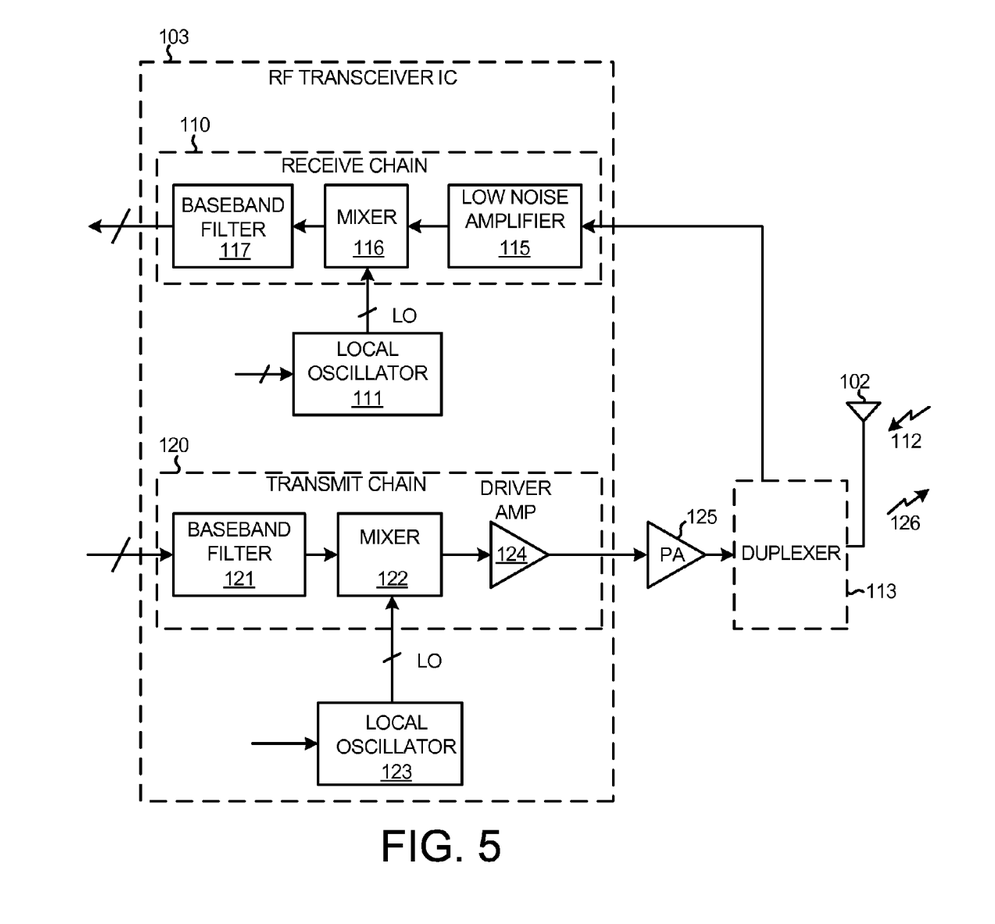
FIG. 5 is a more detailed block diagram of the RF transceiver integrated circuit 103 of FIG. 4.

FIG. 5 is a more detailed block diagram of the RF transceiver integrated circuit 103 of FIG. 5. The receiver includes what is called a "receive chain" 110 as well as a local oscillator 111. When the cellular telephone is receiving, a high frequency RF signal 112 is received on antenna 102. Information from signal 112 passes through duplexer 113, and into receive chain 110. Signal 112 is amplified by low noise amplifier (LNA) 115 and is down-converted in frequency by mixer 116. The resulting down-converted signal is filtered by baseband filter 117 and is passed to the digital baseband integrated circuit 104. An analog-to-digital converter 118 in the digital baseband integrated circuit 104 converts the signal into digital form and the resulting digital information is processed by digital circuitry in the digital baseband integrated circuit 104.

If the cellular telephone is transmitting, then information to be transmitted is converted into analog form by a digital-to-analog converter 119 in the digital baseband integrated circuit 104 and is supplied to a "transmit chain" 120. Baseband filter 121 filters out noise due to the digital-to-analog conversion process. Mixer 122, under control of local oscillator 123, then up-converts the signal into a high frequency signal. Driver amplifier 124 and an external power amplifier 125 amplify the high frequency signal to drive antenna 102 so that a high frequency RF signal 126 is transmitted from antenna 102. The digital baseband integrated circuit 104 tunes the transmitter by controlling the frequency of a local oscillator signal or signals LO supplied by local oscillator 123 to mixer 122.

Figure 6:
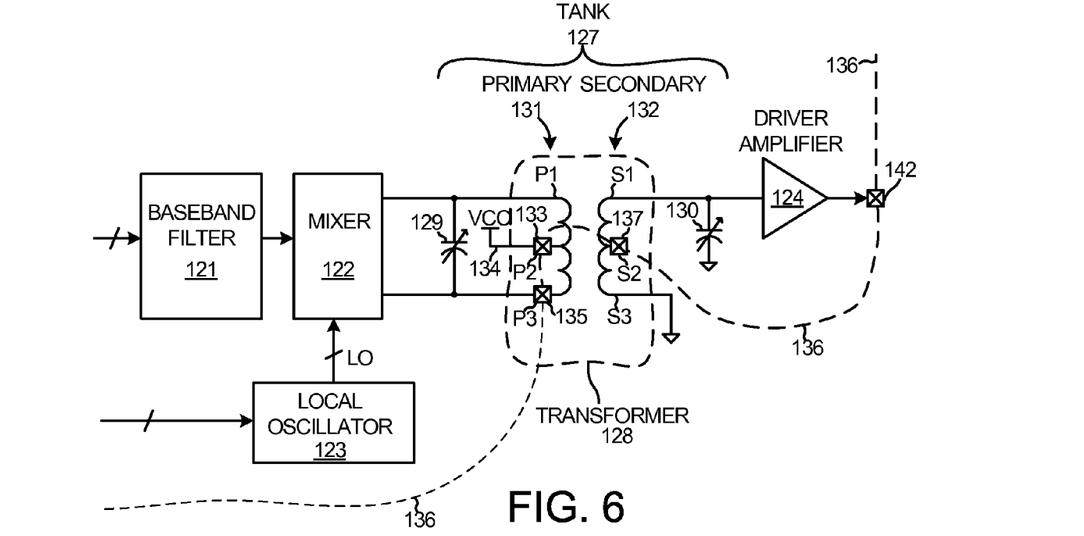
FIG. 6 is a more detailed diagram of the mixer 122 and the driver amplifier 124 of FIG. 5, as well as a novel transformer 128 that couples the mixer 122 to the driver amplifier 124.

FIG. 6 is a more detailed diagram that shows how mixer 122 is coupled via a tuned tank circuit 127 to driver amplifier 124. Tank 127 performs a differential to single-ended conversion function in that it receives a differential signal from mixer 122, performs differential to single-ended conversion, and supplies a single-ended signal to driver amplifier 124. Tank 127 also performs a current to voltage conversion function in that it converts a current signal from mixer 122 into a voltage signal that is supplied to driver amplifier 124.

Tank 127 includes a novel transformer 128, a primary capacitor 129 and a secondary capacitor 130. The arrows through the capacitor symbols 129 and 130 indicate that the primary and secondary capacitors are programmable variable capacitors. The capacitances of capacitors 129 and 130 can be changed by digital circuitry (not illustrated). Transformer 128 includes a primary 131 and a secondary 132. The primary 131 includes a first portion that extends from node P1 to node P2. Node P2 is a tap on the primary, and is connected to a terminal 133 of the RF transceiver integrated circuit 103. Node P2 is also coupled within RF transceiver integrated circuit 103 to a DC supply voltage conductor 134. The DC supply voltage is identified here as VCC. Primary 131 also includes a second portion that extends from node P2 to node P3. Node P3 is connected to a terminal 135 of the RF transceiver integrated circuit 103. The dashed line 136 represents the boundary of the RF transceiver integrated circuit 103. The second portion of the primary is disposed outside RF transceiver integrated circuit 103 in a non-semiconductor substrate 143 as described in further detail below.

The secondary 132 also includes a first portion and a second portion. The first portion of the secondary extends from node S1 to node S2. Node S2 is a tap on the secondary. Node S2 is connected to a terminal 137 of RF transceiver integrated circuit 103. The second portion of the secondary extends from node S2 to node S3. As indicated by dashed line 136, the second portion of the secondary is disposed outside RF transceiver integrated circuit 103.

Figure 7:
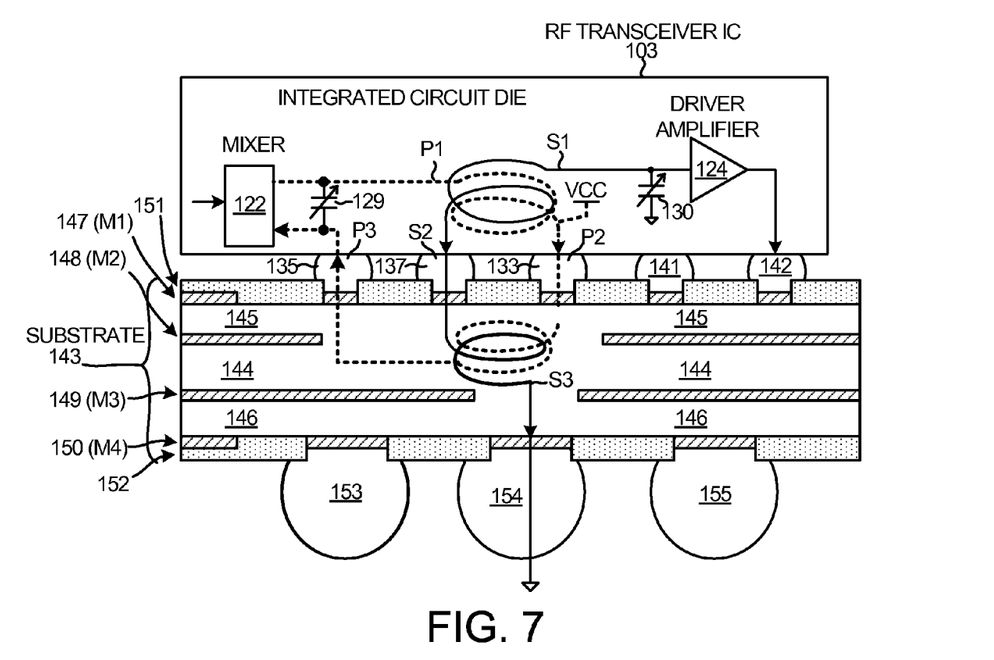
FIG. 7 is a simplified cross-sectional diagram that shows how the novel transformer 128 of FIG. 6 is disposed partly in integrated circuit 103 and partly in non-semiconductor substrate 143.

FIG. 7 is a simplified cross-sectional diagram of RF transceiver integrated circuit 103. RF transceiver integrated circuit 103 is flip-chip mounted by a plurality of microbumps ("bumps") 135, 137, 133, 141 and 142 to a non-semiconductor multi-layer substrate 143. Non-semiconductor substrate 143, in this example, is the substrate of a ball grid array (BGA) integrated circuit package. Substrate 143 is not a structure realized on a semiconductor wafer using semiconductor wafer fabrication steps. Substrate 143 does not include a substrate layer of single-crystal semiconductor wafer material. Non-semiconductor substrate 143, for example, may be a multi-layer laminated ceramic structure, or a multi-layer pressed ceramic structure, or a multi-layer laminated plastic structure or a multi-layer epoxy-resin structure such as FR4 fiberglass/epoxy-resin. Alternatively, other non-semiconductor substrate material may be used. In the present example, non-semiconductor substrate 143 is a laminated structure and includes an epoxy-resin dielectric layer 144 that is 60 microns thick. Layer 144 is a material known by the tradename CCL-HL832 BT. The material is commercially available from Mitsubishi Gas and Chemical Company, Inc. of Tokyo, Japan. The "BT" refers to Bismalimide Triazine. The "CCL" indicates that it is copper-clad. Non-semiconductor substrate 143 further includes two other 40 micron thick dielectric layers 145 and 146 as well as four 15 micron thick layers of copper interconnect 147-150. Dielectric layers 145 and 146 are of a material known by the tradename HL830NX-A, available from Mitsubishi Gas and Chemical Company, Inc. of Tokyo, Japan. The top and bottom major surfaces of non-semiconductor substrate 143 include solder mask layers 151 and 152, respectively. Surface mount solder balls 153-155 are attached to metal interconnect layer 150 using multiple other flip-chip metal layers (not shown) including adhesion layers and barrier metal layers.

As illustrated in FIG. 7, the second portion of the primary and the second portion of the secondary are disposed in the non-semiconductor substrate 143. Node S3, which is within substrate 143, is coupled through solder ball 154 to a ground conductor (not shown) in an underlying printed circuit board to which the overall BGA package is attached within mobile communication device 100. In some embodiments, the BGA integrated circuit package also includes digital baseband integrated circuit 104 and power amplifier 125 and other components. Integrated circuit die 103, as well as other integrated circuit dice that are attached to substrate 143, are encapsulated by another portion (not shown) of the BGA package.

Figure 8:
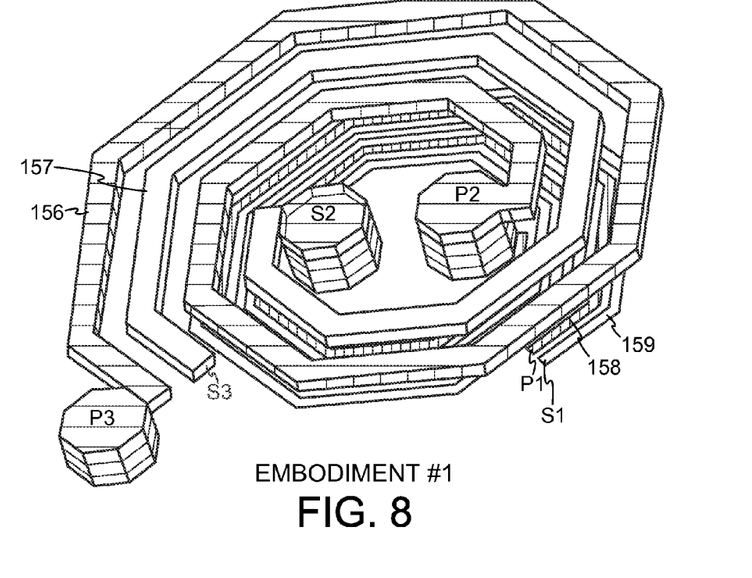
FIG. 8 is a perspective view of the transformer 128 of FIG. 6.

FIG. 8 is a simplified perspective view of the conductors and microbumps of novel transformer 128. The dielectric layers and other structures in the vicinity of transformer 128 are not shown so that the primary and secondary and interconnecting microbumps will be more apparent in the diagram. The second portions of the primary and secondary that are realized in the non-semiconductor substrate 143 are seen on the top in the view of FIG. 8, facing outward from the page. The thicker conductors 156 and 157 are conductors of the second portions of the primary and secondary, respectively. Conductors 156 and 157 are realized in metal layer 147 (M1), whereas the thinner conductors 158 and 159 of the first portions of the primary and secondary are realized in metal layers in RF transceiver integrated circuit 103. There is at least one turn of each of conductors 156 and 157 as illustrated, and there is at least one turn of each of conductors 158 and 159 as illustrated.

Figure 9:
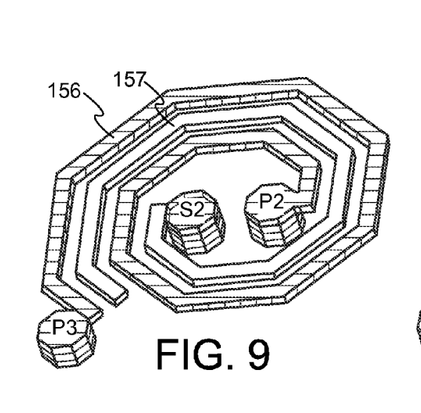
FIG. 9 is a perspective view of the metal conductors of transformer 128 of FIG. 8 that are disposed in non-semiconductor substrate 143.
Figure 10:
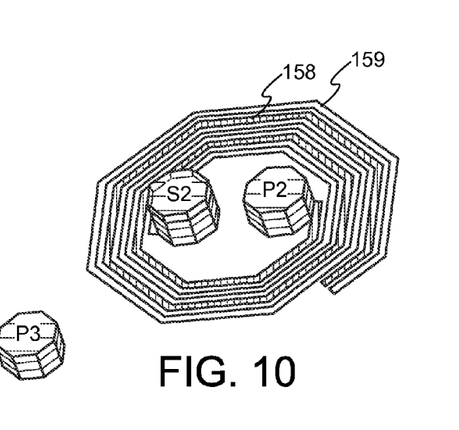
FIG. 10 is a perspective view of the metal conductors of transformer 128 of FIG. 8 that are disposed in integrated circuit 103.

FIG. 9 is a partial view of the structure of FIG. 8. FIG. 9 shows the thicker conductors 156 and 157 that are realized in non-semiconductor substrate 143. The thicker conductors 156 and 157 are approximately 30 microns wide, and there is approximately 30 microns of spacing between the second portions of the primary and secondary. FIG. 10 is a partial view of the structure of FIG. 8. FIG. 10 shows the thinner conductors 158 and 159 that are realized in RF transceiver integrated circuit 103. The thinner conductors 158 and 159 are approximately 10 microns wide, and there is approximately two microns of spacing between the first portions of the primary and secondary.

Figure 11:
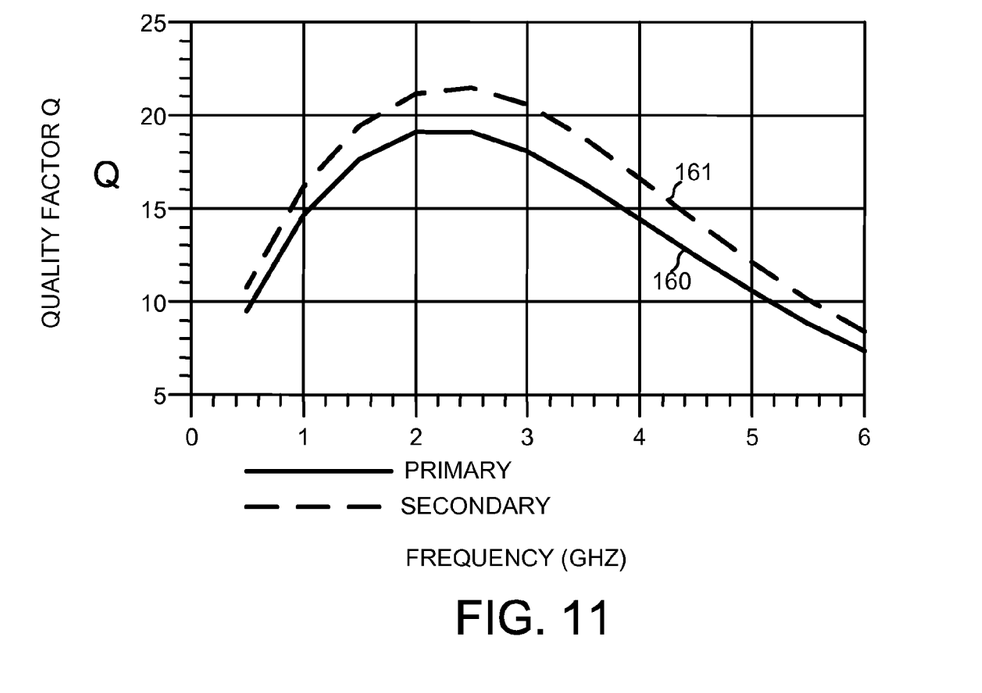
FIG. 11 is a chart that shows how the quality factor Q of the primary and secondary of the transformer 128 of FIG. 6 vary with frequency.

The novel transformer 128 has a transformer quality factor Q, measured at two gigahertz, that is at least ten and in the example of FIGS. 6-10 is approximately 19. The quality factor Q of a transformer, as the term is used here, means the quality factor Q of which ever one of the primary or secondary has the smallest quality factor Q. FIG. 11 is a chart that shows the quality factor of primary 131 and secondary 132 of transformer 128 of FIGS. 6-10. Line 160 represents the quality factor Q of primary 131. Line 161 represents the quality factor Q of secondary 132. At two gigahertz, transformer 128 has a quality factor Q of approximately 19, because the primary has a quality factor of approximately 19 at two gigahertz and because the secondary has a quality factor of greater than 19 at two gigahertz. At two gigahertz, the primary has an inductance of approximately 1.4 nH, and the secondary has an inductance of approximately 1.4 nH.

Figure 12:
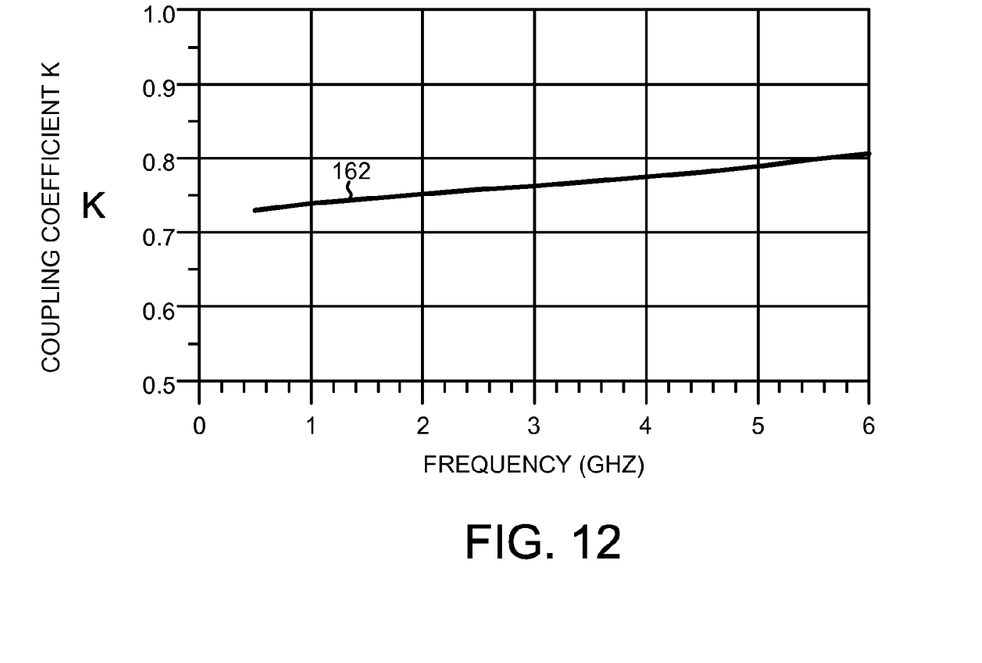
FIG. 12 is a chart that shows how the coupling coefficient k of the primary and secondary of the transformer 128 of FIG. 6 vary with frequency.

FIG. 12 is a chart that shows the coupling coefficient k of transformer 128. The coupling coefficient k is a number between zero and one that expresses the degree of electrical coupling that exists between two circuits. It is calculated as the ratio of the mutual impedance to the square root of the product of the self-impedances of the coupled circuits, where all impedances are expressed in the same units. In FIG. 12, line 162 represents the coupling coefficient k of transformer 128. Transformer 128 has a coupling coefficient k, measured at two gigahertz, that is at least 0.4 and in the example of FIGS. 6-10 is approximately 0.75.

Figure 13:
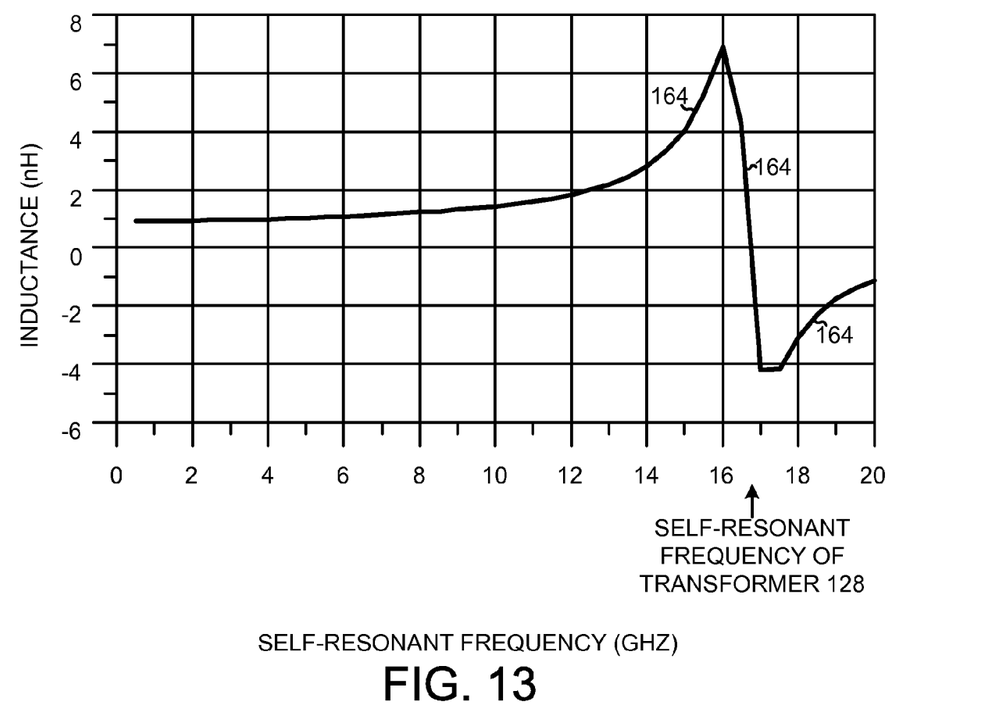
FIG. 13 is a chart that shows the self-resonant frequency of the transformer 128 of FIG. 6.

FIG. 13 is a chart that shows the self-resonant frequency of transformer 128. As indicated by FIG. 13, the self-resonant frequency of transformer 128 is approximately 17 gigahertz. Transformer self-resonance is due to an LC circuit involving the inductances of the primary and secondary and involving parasitic capacitances in the transformer structure.

In one advantageous aspect, transformer 128 has a Q of at least ten and also has a coupling coefficient of at least 0.4. If a transformer were to be realized as two spiral coupled inductors in a single layer of metal in an ordinary non-semiconductor substrate such as an FR4 printed circuit board of a BGA package, then the primary and secondary would principally only be coupled horizontally. As a result, a low coupling coefficient in the range of 0.2 or 0.3 would be achieved. A relatively high quality factor Q may, however, have been achieved due to high quality and low resistance metallization of the FR4 substrate. If a transformer were to be integrated on-chip using the structure illustrated in FIG. 3, on the other hand, then the primary and secondary conductors could be placed quite close to one another using finely controlled metallization that is realizable using common semiconductor fabrication processes. As a result, the structure of FIG. 3 could have a high coupling coefficient of 0.7 or greater. Unfortunately, the on-chip structure of FIG. 3 would likely involve significant parasitic capacitance between the metal conductor and other nearby structures in the semiconductor die. The substantial resistance of on-chip intermetallization layer vias used to realize so-called "cross-overs" in the primary and secondary would reduce the transformer quality factor Q. Two such cross-overs are indicated in FIG. 3 by reference numerals 190 and 191. As a result of these structural drawbacks, the quality factor Q of the on-chip transformer structure would generally be less than ten and the on-chip transformer would have an undesirably low self-resonant frequency. In one novel aspect, it is recognized that transformer 128 of mobile communication device 100 only need have a coupling coefficient k that is slightly greater than 0.4. It is further recognized that this coupling coefficient can be realized by providing part of transformer 128 in integrated form within die 103, and by providing part of transformer 128 in non-semiconductor substrate 143. This 0.4 coupling coefficient can be realized while also realizing a transformer quality factor Q above ten. Moreover, by utilizing low resistance microbumps to realize cross-overs rather than higher resistance on-chip vias, a transformer quality factor Q of 19 well in excess of the desired transformer quality factor Q of ten is achieved. The primary and secondary are not just coupled horizontally, but rather are vertically and coaxially coupled as well as illustrated in FIG. 7. Novel transformer 128 therefore only occupies a 310 micron by 350 micron area of die 103. An equal area of 310 microns by 350 microns is required in substrate 143. Novel transformer 128 and its connections to mixer 122 and to driver amplifier 124 require three microbumps.

Although the transformer 128 of FIG. 8 works well in many applications, there are applications in which the manufacture and testing of RF transceiver integrated circuit 103 involves wafer probe testing. Wafer probe testing involves exercising and testing the performance and characteristics of circuitry of an integrated circuit while the integrated circuit is part of a processed wafer of integrated circuits before the wafer has been scribed and cut to singulate dice. A test head having many small probes is brought toward an integrated circuit on the wafer such that the probes make physical and electrical contact with microbumps on the integrated circuit. After the head and probes have been made to physically and electrically contact the desired microbumps, the integrated circuit is energized and tested through the probes. Such testing of the RF transceiver integrated circuit 103 of FIG. 8 may, however, be difficult or impossible to carry out because the transformer 128 does not exist in its entirety prior to integrated circuit die 103 being flip-chip mounted onto substrate 143. The transformer coupling of mixer 122 to driver amplifier 124 cannot, therefore, be easily tested at the wafer probe stage.

Figure 14:
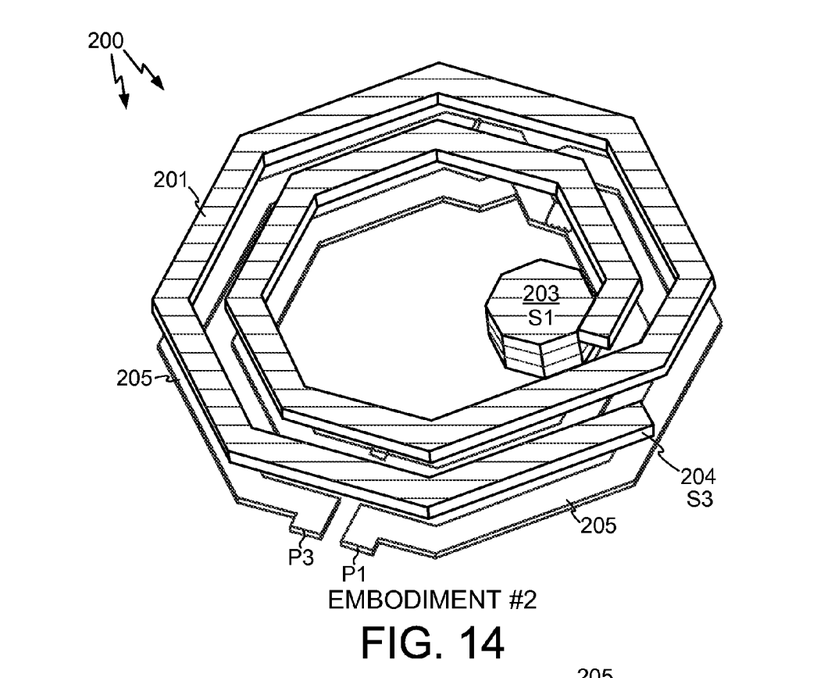
FIG. 14 is a simplified perspective view of a second embodiment 200 of a transformer in accordance with a second novel aspect.

FIG. 14 is a simplified perspective view of a second embodiment 200 of a transformer. This second embodiment is more easily tested at the wafer probe test stage than is the first embodiment of FIG. 8. As in the example of FIG. 8, the dielectric layers and other structures are not shown in the view of FIG. 15 so that the structure of the primary and secondary conductors will be revealed. In the same way that mixer 122 drives driver amplifier 124 through the transformer of FIG. 8 if the transformer of FIG. 8 is embodied in integrated circuit 103, so too does mixer 122 drive driver amplifier 124 through the transformer of FIG. 14 if the embodiment of FIG. 14 is embodied in integrated circuit 103.

Figure 15:
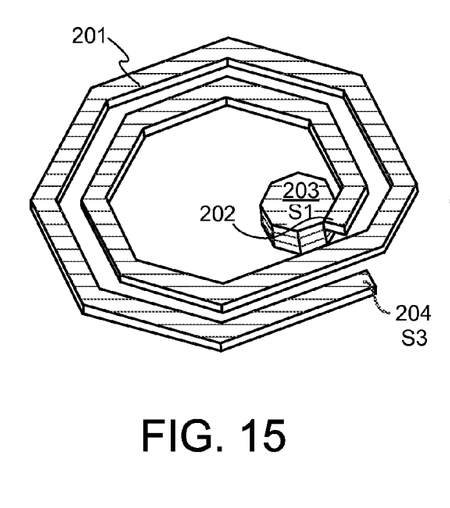
FIG. 15 is a perspective view of the secondary conductor of the transformer of FIG. 14 that is disposed in non-semiconductor substrate 143.

FIG. 15 is a perspective view of conductor 201 of the secondary of the transformer of FIG. 14. The secondary is entirely disposed in non-semiconductor substrate 143. A first end 202 of the secondary is coupled by microbump 203 to integrated circuit 103 and on to the input lead of driver amplifier 124. A second end 204 of the secondary is grounded to a ground conductor within substrate 143. A microbump is therefore not provided at the second end 204 to ground the second end 204. The spiral-shaped secondary has an inductance of approximately 2.0 nH at two gigahertz.

Figure 16:
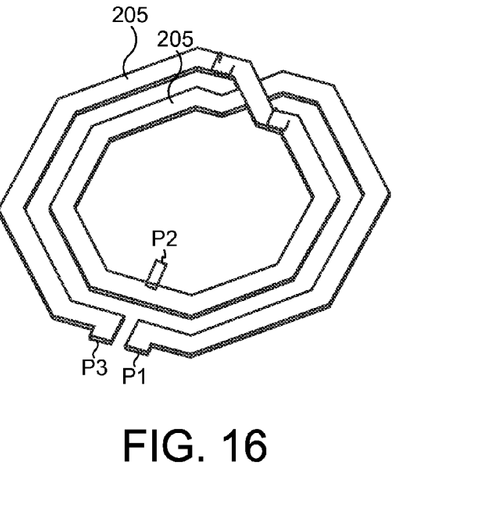
FIG. 16 is a perspective view of the primary conductor of the transformer of FIG. 14 that is disposed in integrated circuit die 103.

FIG. 16 is a perspective view of the conductor 205 of the primary of the transformer of FIG. 14. Conductor 205 is entirely disposed in integrated circuit 103. Label P1 identifies a first end of the primary that is coupled to a first output node of mixer 122. Label P3 identifies a second end of the primary that is coupled to a second output node of mixer 122. Label P2 identifies a tap on the primary that is coupled to a supply voltage conductor as illustrated in FIG. 6. The primary has an inductance of approximately 1.0 nH at two gigahertz. The transformer occupies a 345 micron by 340 micron area on the RF transceiver integrated circuit die 103.

Figure 17:
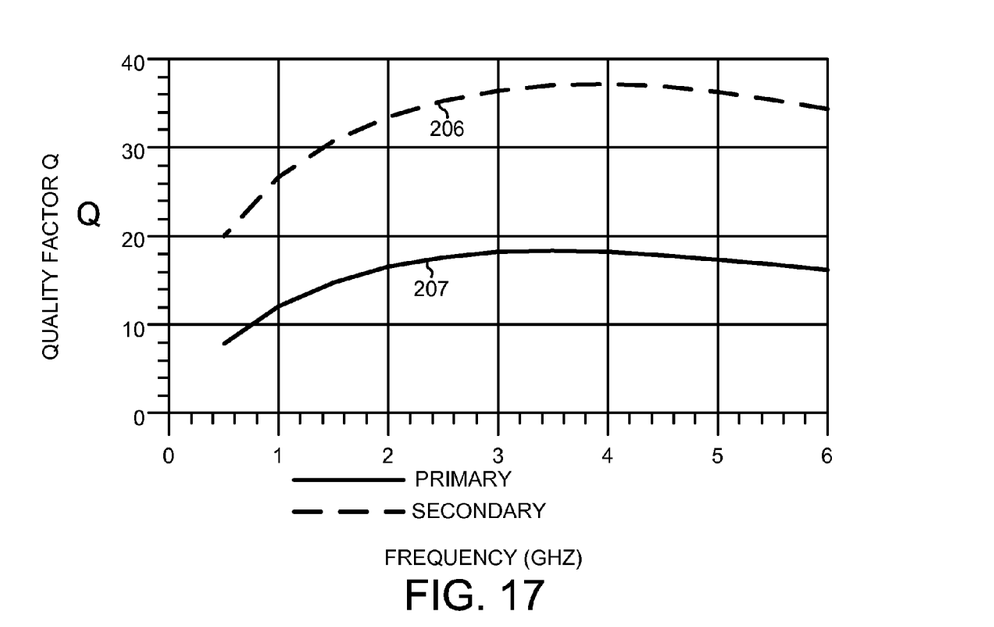
FIG. 17 is a chart that shows how the quality factor Q of the primary and secondary of the transformer of FIG. 14 vary with frequency.

FIG. 17 is a chart that shows how the quality factor Q of the primary and secondary vary with frequency. Line 207 represents the quality factor Q of the primary whereas line 206 represents the quality factor Q of the secondary. At two gigahertz, the primary has a Q of approximately 16 and the secondary has a Q of approximately 33. The transformer is therefore said to have a transformer quality factor Q at two gigahertz of approximately 16.

Figure 18:
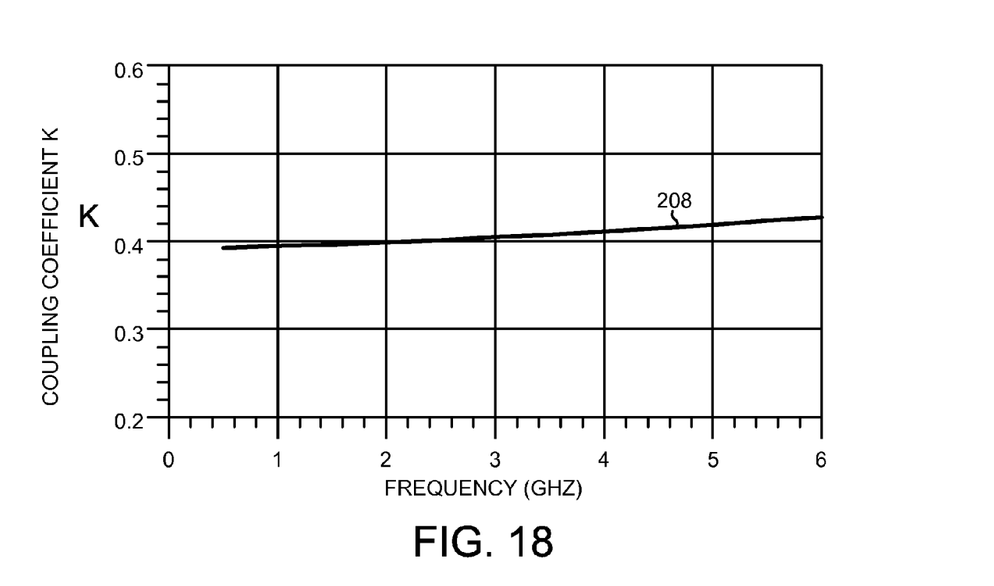
FIG. 18 is a chart that shows how the coupling coefficient k of the transformer of FIG. 14 varies with frequency.

FIG. 18 is a chart that shows how the coupling coefficient k of the transformer of FIG. 14 changes with frequency. Line 208 represents the coupling coefficient k.

Figure 19:
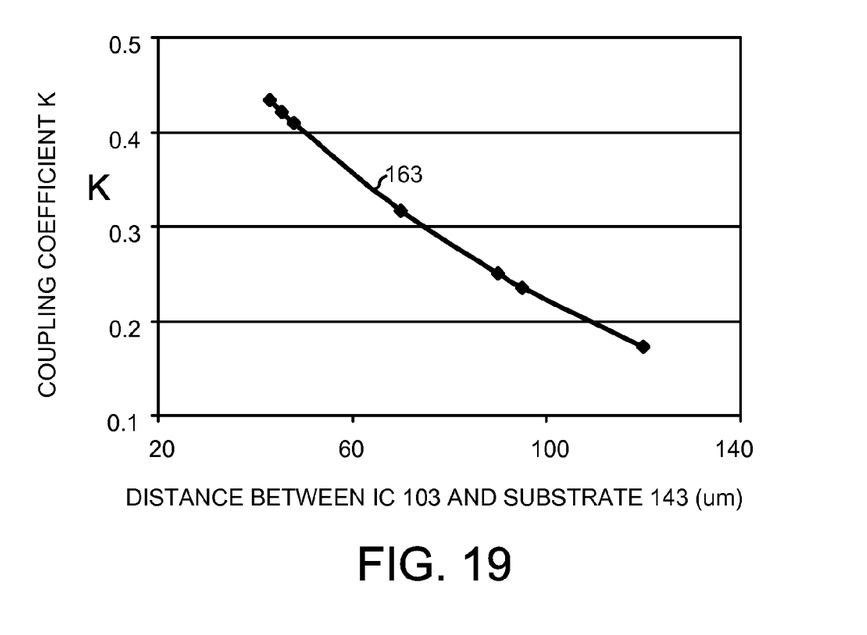
FIG. 19 is a chart that shows how the coupling coefficient k of the transformer of FIG. 14 varies with changes in the distance (measure along a coaxial axis) between the integrated circuit 103 and the substrate 143.

FIG. 19 is a chart that shows how the coupling coefficient k changes as a function of the distance between IC 103 and substrate 143 in the embodiment of FIG. 14. Line 163 represents the coupling coefficient k. In the example of FIGS. 14-16, the distance (measured along a coaxially axis of the primary and secondary) between primary conductor 205 and secondary conductor is approximately 46 microns.

Whereas in the first embodiment of FIG. 8 part of the primary and part of the secondary are realized in non-semiconductor substrate 143, in the second embodiment of FIG. 14 the primary is entirely realized on integrated circuit 103 and the secondary is entirely realized in substrate 143. Because only one microbump 203 is used to connect the secondary to the input node of driver amplifier 124, a wafer probe head can be modified to embody a secondary inductor that has the same approximate shape as the shape illustrated in FIG. 15. The wafer probe head, rather than including microbump 203, has a probe in the place at the location of microbump 203. One end of the probe is coupled to the end 202 of the test secondary. The other end of the probe is made to contact microbump 203. When the wafer probe head has landed and the probe has contacted the microbump, the test secondary of the wafer probe head is disposed with respect to the primary in the approximate orientation illustrated in FIG. 14. The test head then energizes integrated circuit 103 through its probes and mixer 122 drives the driver amplifier 124 through the transformer. The transformer at this point includes the primary on integrated circuit 103 and the test secondary on the wafer probe test head. The wafer probe test head exercises and tests the performance of integrated circuit 103. After the test, the wafer probe test head is moved to the next integrated circuit on the wafer and the test process is repeated. It is therefore seen that the test is not a test of the actual assembled transformer, but rather is a test involving a substitute test secondary that is part of the wafer probe test head.

Figure 20:
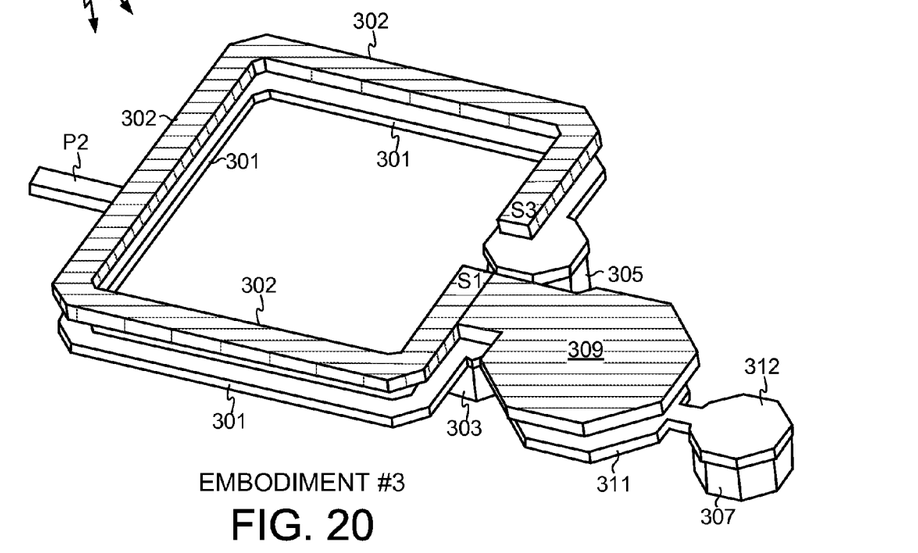
FIG. 20 is a simplified perspective view of a third embodiment 300 of a transformer in accordance with a third novel aspect.

In the second embodiment of FIG. 14, the primary is integrated onto integrated circuit die 103. The second embodiment of the transformer therefore occupies an amount of die area. If the non-semiconductor substrate employed has three or more layers of metal interconnect, then a third embodiment 300 as illustrated in FIG. 20 can be employed. In the third embodiment 300 of FIG. 20, both the primary and the secondary are entirely disposed in the non-semiconductor substrate 143.

FIG. 20 is a perspective view of the third embodiment 300 of the novel transformer. The third embodiment 300 is viewed from a vantage point below substrate 143 looking up toward the face-side of integrated circuit 103. The dielectric layers and the integrated circuit 103 are not illustrated in the view of FIG. 20 so that the structure of the transformer will be more apparent. The entire transformer, including conductor 301 of the primary and conductor 302 of the secondary, is disposed in the non-semiconductor substrate 143.

Figure 21:
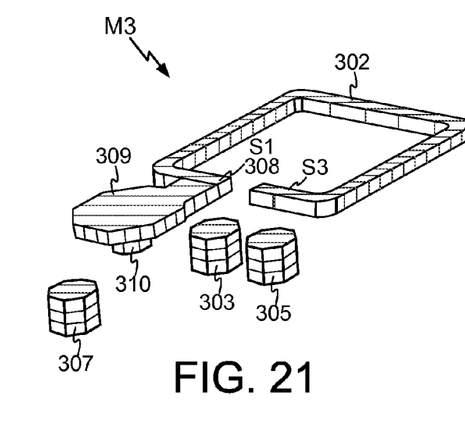
FIG. 21 is a perspective view of the secondary conductor of the transformer of FIG. 20 that is disposed in non-semiconductor substrate 143.
Figure 22:
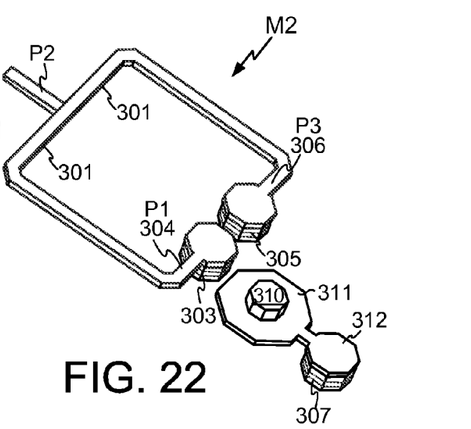
FIG. 22 is a perspective view of the primary conductor of the transformer of FIG. 20 that is disposed in non-semiconductor substrate 143.

FIG. 21 is a perspective view of the secondary without the primary. FIG. 22 is a perspective view of the primary without the secondary. A first microbump 303 connects a first end 304 of primary conductor 301 to a first output node of mixer 122 of integrated circuit 103. A second microbump 305 connects a second end 306 of primary conductor 301 to a second output node of mixer 122 of integrated circuit 103. Reference numeral P1 identifies the first end of the primary, P2 identifies the tap on the primary, and P3 identifies the second end of the primary. A third microbump 307 connects a first end 308 of secondary conductor 302 to the input node of driver amplifier 124. The connection extends from first end 308, through pad 309, vertically through conductive via 310, to pad 311, laterally to pad 312, and vertically through third microbump 307 to the driver amplifier input node within integrated circuit 103. Reference numeral S1 identifies the first end of the secondary. Reference numeral S3 identifies the second end of the secondary that is connected to a ground conductor within substrate 143. The primary has an inductance of approximately 0.9 nH at two gigahertz and the secondary has an inductance of approximately 1.0 nH at two gigahertz. The transformer occupies an area in substrate 143 of 522 microns by 533 microns. Because the primary and the secondary are realized entirely in substrate 143, the transformer consumes only a negligible amount of area on integrated circuit 103.

Figure 23:
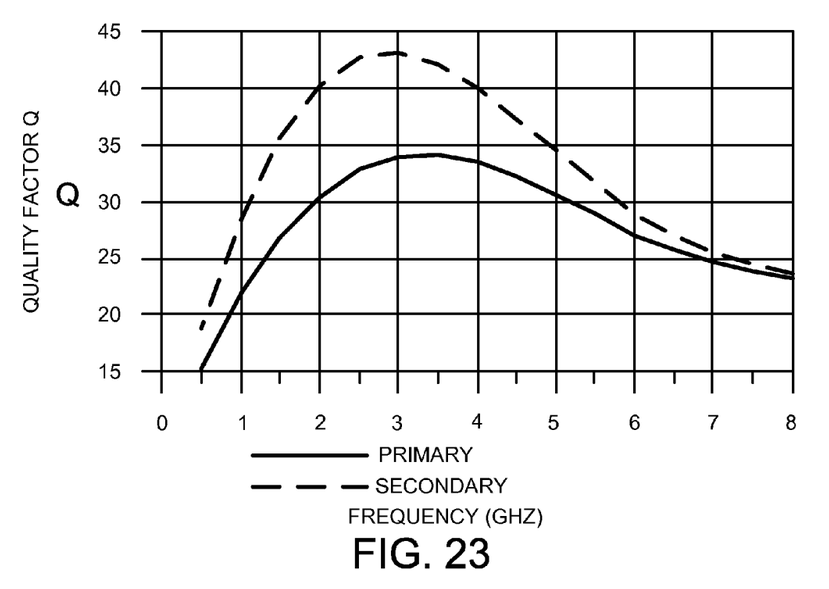
FIG. 23 is a chart that shows how the quality factor Q of the primary and secondary of the transformer of FIG. 20 vary with frequency.

FIG. 23 is a chart that shows the quality factor Q of the primary and the quality factor Q of the secondary for the third embodiment 300 of FIGS. 20-22. The third embodiment 300 of the transformer has a transformer quality factor of approximately 30 at two gigahertz.

Figure 24:
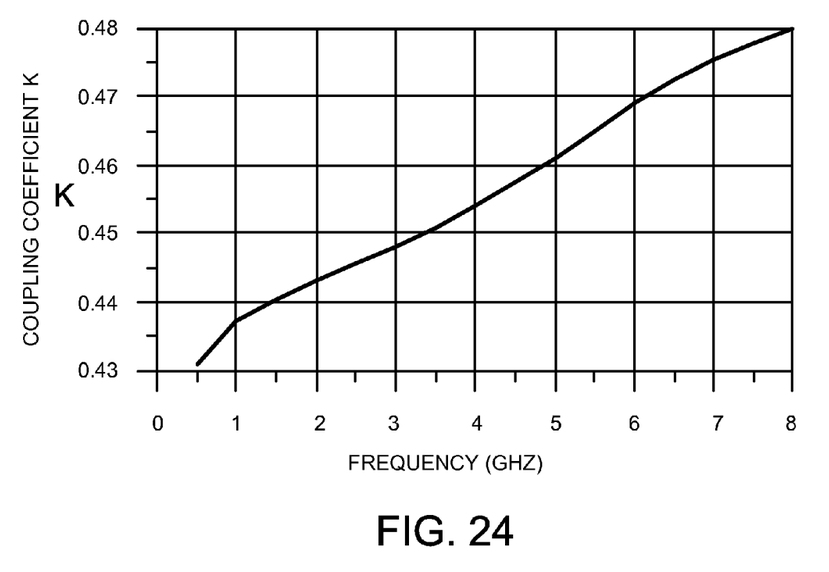
FIG. 24 is a chart that shows how the coupling coefficient k of transformer of FIG. 15 varies with frequency.

FIG. 24 is a chart that shows the coupling coefficient k of the third embodiment 300 of FIGS. 20-22. At two gigahertz, the third embodiment 300 of the transformer has a coupling coefficient of approximately 0.44.

Figure 25:
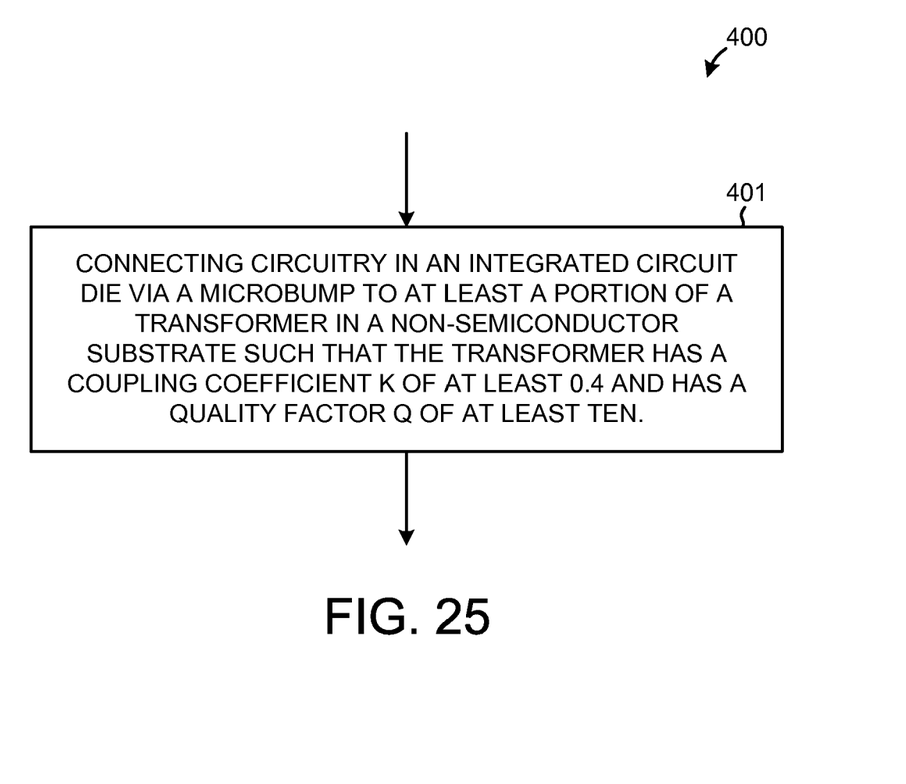
FIG. 25 is a flowchart of a method 400 in accordance with one novel aspect.

FIG. 25 is a flowchart of a one-step method 400 in accordance with one novel aspect. In step 401, circuitry in an integrated circuit die (for example, an input node of driver amplifier 124 of RF transceiver integrated circuit die 103 of FIG. 7) is connected via a flip-chip microbump (for example, microbump 137) to at least a portion of a transformer in an non-semiconductor substrate (for example, substrate 143) such that the transformer has a coupling coefficient k of at least 0.4 and has a quality factor Q of at least ten. In one example, the portion of the transformer is the portion illustrated in substrate 143 of FIG. 7. In a second example of the novel method 400, the microbump is microbump 203 in FIG. 15. This microbump 203 is connected to the input node of driver amplifier 124 of integrated circuit 103 of FIG. 7. In a third example of the novel method 400, the microbump is the microbump 307 in FIG. 20. This microbump 307 is connected to the input node of driver amplifier 124 of integrated circuit 103 of FIG. 7. In method 400, either some or substantially all or all of the novel transformer is disposed in the non-semiconductor substrate.

Although certain specific embodiments are described above for instructional purposes, the teachings of this patent document have general applicability and are not limited to the specific embodiments described above. Accordingly, various modifications, adaptations, and combinations of the various features of the described specific embodiments can be practiced without departing from the scope of the claims that are set forth below.

What is claimed is:

1. A structure comprising:
a non-semiconductor substrate that includes a portion of a transformer; and
an integrated circuit die that is bonded to the non-semiconductor substrate by a plurality of microbumps, wherein the portion of the transformer in the non-semiconductor substrate is connected to at least one of the microbumps, wherein the portion of the transformer includes at least one complete turn, and wherein the at least one complete turn is disposed entirely in the non-semiconductor substrate.

2. The structure of claim 1, wherein the portion of the transformer is a first portion of a secondary, wherein a second portion of the secondary is a part of the integrated circuit die, and wherein the first and second portions of the secondary are connected together by said one of the microbumps.

3. The structure of claim 2, wherein the first and second portions of the secondary are substantially coaxial with respect to one another.

4. The structure of claim 3, wherein the non-semiconductor substrate is a substrate of an integrated circuit package.

5. The structure of claim 1, wherein the portion of the transformer is a first portion of a primary, wherein a second portion of the primary is a part of the integrated circuit die, and wherein the first and second portions of the primary are connected together by said one of the microbumps.

6. The structure of claim 5, wherein the first and second portions of the primary are substantially coaxial with respect to one another.

7. The structure of claim 6, wherein the non-semiconductor substrate is a substrate of an integrated circuit package.

8. The structure of claim 1, wherein the portion of the transformer is disposed underneath the integrated circuit die.

9. The structure of claim 1, wherein the portion of the transformer is a portion of a secondary of the transformer, and wherein a primary of the transformer is driven by a mixer.

10. The structure of claim 1, wherein the portion of the transformer is a portion of a primary of the transformer, and wherein the primary of the transformer is driven by a mixer.

11. A structure comprising:
a non-semiconductor substrate that includes a portion of a transformer; and
an integrated circuit die that is bonded to the non-semiconductor substrate by a plurality of microbumps, wherein the portion of the transformer in the non-semiconductor substrate is connected to at least one of the microbumps, wherein the transformer has a coupling coefficient k at two gigahertz of at least 0.4, and wherein the transformer has a transformer quality factor Q at two gigahertz of at least ten.

12. The structure of claim 11, wherein the transformer includes a primary and a secondary, a first portion of the primary being disposed in the integrated circuit die, a second portion of the primary being disposed in the non-semiconductor substrate, the first portion of the primary being connected to a first end of the second portion of the primary by said one of the microbumps, a second end of the second portion of the primary being connected to a second of the microbumps, wherein a first portion of the secondary is disposed in the integrated circuit die, a second portion of the secondary being disposed in the non-semiconductor substrate, and wherein the first portion of the secondary is connected to the second portion of the secondary by a third of the microbumps.

13. The structure of claim 12, wherein the transformer has a self-resonant frequency greater than 4.0 gigahertz.

14. The structure of claim 12, wherein the integrated circuit die includes a mixer, the mixer having a first output node and a second output node, the first output node being connected to an end of the first portion of the primary, and wherein the second output node is connected to the second microbump.

15. The structure of claim 11, wherein the transformer includes a primary and a secondary, the primary being disposed substantially entirely in the integrated circuit die, the secondary being disposed substantially entirely in the non-semiconductor substrate, wherein a first end of the secondary is connected by said one of the microbumps to the integrated circuit die, wherein the non-semiconductor substrate includes a ground node, and wherein a second end of the secondary is connected to the ground node.

16. The structure of claim 15, wherein the secondary includes at least one turn of a conductor, and wherein the secondary includes no cross-overs.

17. The structure of claim 15, wherein the primary is connected to no microbump, and wherein the integrated circuit die includes a mixer having a first output node and a second output node, the first output node being connected to a first end of the primary, the second output node being connected to a second end of the primary.

18. The structure of claim 11,
wherein the transformer includes a primary and a secondary, wherein both the primary and secondary are disposed substantially entirely in the non-semiconductor substrate, and wherein said one of the microbumps is connected to a first end of the primary, a second of the microbumps being connected to a second end of the primary, and a third of the microbumps being connected to the secondary.

19. The structure of claim 18, wherein the secondary includes at least one turn of a conductor, and wherein the secondary includes no cross-overs.

20. A structure comprising:
a non-semiconductor substrate that includes a portion of a transformer; and
an integrated circuit die that is bonded to the non-semiconductor substrate by a plurality of microbumps, wherein the portion of the transformer in the non-semiconductor substrate is connected to at least one of the microbumps, wherein the transformer includes a primary and a secondary, a first portion of the primary being disposed in the integrated circuit die, a second portion of the primary being disposed in the non-semiconductor substrate, and wherein the first portion of the primary is connected to the second portion of the primary by said one of the microbumps.

21. A structure comprising:
a non-semiconductor substrate that includes a portion of a transformer; and
an integrated circuit die that is bonded to the non-semiconductor substrate by a plurality of microbumps, wherein the portion of the transformer in the non-semiconductor substrate is connected to at least one of the microbumps, wherein the transformer includes a primary and a secondary, a first portion of the secondary being disposed in the integrated circuit die, a second portion of the secondary being disposed in the non-semiconductor substrate, and wherein the first portion of the secondary is connected to the second portion of the secondary by said one of the microbumps.

22. A structure comprising:
a non-semiconductor substrate that includes a portion of a transformer; and
an integrated circuit die that is bonded to the non-semiconductor substrate by a plurality of microbumps, wherein the portion of the transformer in the non-semiconductor substrate is connected to at least one of the microbumps, wherein the transformer includes a primary and a secondary, the primary being disposed substantially entirely in the integrated circuit die, the secondary being disposed substantially entirely in the non-semiconductor substrate, and wherein the secondary is connected by said one of the microbumps to the integrated circuit die.

23. A method comprising:
connecting circuitry in an integrated circuit die via a first microbump to at least a portion of a transformer in a non-semiconductor substrate, wherein the portion of the transformer includes at least one complete turn, and wherein the at least one complete turn is disposed entirely in the non-semiconductor substrate.

24. The method of claim 23, wherein said connecting involves flip-chip mounting the integrated circuit die to the non-semiconductor substrate by a plurality of microbumps, the first microbump being one of the plurality of microbumps.

25. A method comprising:
connecting circuitry in an integrated circuit die via a first microbump to at least a portion of a transformer in a non-semiconductor substrate, wherein said connecting involves flip-chip mounting the integrated circuit die to the non-semiconductor substrate by a plurality of microbumps, the first microbump being one of the plurality of microbumps, wherein the transformer has a coupling coefficient k at two gigahertz of at least 0.4, and wherein the transformer has a transformer quality factor Q at two gigahertz of at least ten.

26. The method of claim 25, further comprising: connecting the circuitry in the integrated circuit die via a second microbump of the plurality of microbumps to the portion of the transformer in the non-semiconductor substrate.

27. The method of claim 26, wherein the transformer includes a primary and a secondary, and wherein the portion is the secondary.

28. The method of claim 26, wherein the transformer includes a primary and a secondary, and wherein the portion is a portion of the secondary.

29. The method of claim 26, wherein the transformer includes a primary and a secondary, and wherein the portion is the primary.

30. The method of claim 26, wherein the transformer includes a primary and a secondary, and wherein the portion is a portion of the primary.

31. A method comprising:
providing a microbump that is directly connected to one of an output node of a mixer and an input node of a driver amplifier, wherein the mixer and the driver amplifier are parts of an integrated circuit die, and wherein the microbump is a part of the integrated circuit die.

32. The method of claim 31, further comprising:
providing a programmable variable capacitor that is connected to said one of the output node of the mixer and the input node of the driver amplifier.

33. The method of claim 31, wherein the microbump is directly connected to at least one complete turn of a conductor.

34. An integrated circuit die comprising:
a mixer having a first output node and a second output node;
a driver amplifier having an input node; and
a first microbump that is connected via a conductor to one of the first output node of the mixer, the second output node of the mixer and the input node of the driver amplifier.

35. The integrated circuit die of claim 34, wherein the conductor is at least a part of a primary of a transformer, the transformer including a secondary, wherein the secondary is connected to the input node of the driver amplifier.

36. The integrated circuit die of claim 34, wherein the conductor is at least a part of a secondary of a transformer, the transformer including a primary, wherein the primary is connected to first output node of the mixer.

37. A packaged integrated circuit, comprising:
an integrated circuit die that includes a circuit and a microbump; and
means that is connected to the integrated circuit die by the microbump, wherein the means is for providing at least a part of a transformer such that the part of the transformer is connected to the circuit through the microbump, such that the transformer has a coupling coefficient k at two gigahertz of at least 0.4, such that the transformer has a quality factor Q at two gigahertz of at least ten, and such that the transformer has a self-resonant frequency greater than 4.0 gigahertz.

38. The packaged integrated circuit of claim 37, wherein the circuit includes a mixer and a driver amplifier, and wherein the mixer drives the driver amplifier through the transformer.

39. The packaged integrated circuit of claim 37, wherein the means is a non-semiconductor substrate of a ball grid array (BGA) package.

* * * * *